(12) United States Patent
DeLaCruz et al.

(10) Patent No.: US 12,288,771 B2
(45) Date of Patent: Apr. 29, 2025

(54) APPARATUS FOR NON-VOLATILE RANDOM ACCESS MEMORY STACKS

(71) Applicant: Adeia Semiconductor Technologies LLC, San Jose, CA (US)

(72) Inventors: Javier A. DeLaCruz, San Jose, CA (US); Belgacem Haba, Saratoga, CA (US); Rajesh Katkar, Milpitas, CA (US); Pearl Po-Yee Cheng, Los Altos, CA (US)

(73) Assignee: Adeia Semiconductor Technologies LLC, San Jose, CA (US)

(*) Notice: Subject to any disclaimer, the term of this patent is extended or adjusted under 35 U.S.C. 154(b) by 0 days.

(21) Appl. No.: 18/519,538

(22) Filed: Nov. 27, 2023

(65) Prior Publication Data

US 2024/0145438 A1    May 2, 2024

Related U.S. Application Data

(63) Continuation of application No. 17/122,149, filed on Dec. 15, 2020, now Pat. No. 11,876,076.

(Continued)

(51) Int. Cl.
*H01L 25/065* (2023.01)
*H01L 23/00* (2006.01)
*H01L 25/18* (2023.01)

(52) U.S. Cl.
CPC .......... *H01L 25/0657* (2013.01); *H01L 24/08* (2013.01); *H01L 25/18* (2013.01);
(Continued)

(58) Field of Classification Search
None
See application file for complete search history.

(56) References Cited

U.S. PATENT DOCUMENTS 5,753,536 A    5/1998 Sugiyama et al.
5,771,555 A    6/1998 Eda et al.
(Continued)

FOREIGN PATENT DOCUMENTS

JP    2013-033786 A    2/2013
JP    2018-160519    10/2018
WO   WO 2005/043584 A2   5/2005

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(Continued)

*Primary Examiner* — Hung K Vu
(74) *Attorney, Agent, or Firm* — Knobbe, Martens, Olson & Bear, LLP

(57) ABSTRACT

A memory structure is provided, including a NAND block comprising a plurality of oxide layers, the plurality of layers forming a staircase structure at a first edge of the NAND block, a plurality of vias disposed on the staircase structure of NAND block, two or more of plurality of vias terminating along a same plane, a plurality of first bonding interconnects disposed on the plurality of vias, a plurality of bitlines extending across the NAND block, and a plurality of second bonding interconnects disposed along the bitlines. The memory structure may be stacked on another of the memory structure to form a stacked memory device.

21 Claims, 9 Drawing Sheets

Related U.S. Application Data

(60) Provisional application No. 62/951,668, filed on Dec. 20, 2019.

(52) U.S. Cl.
CPC ........... *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,593,690 B2 | 3/2020 | Lu et al. | |
| 10,679,721 B2 | 6/2020 | Kim et al. | |
| 10,679,941 B2 | 6/2020 | Zhu et al. | |
| 10,707,087 B2 | 7/2020 | Uzoh et al. | |
| 10,768,222 B1 | 9/2020 | Brozek | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,177,231 B2 | 11/2021 | Pan et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,476,213 B2 | 10/2022 | Haba et al. | |
| 11,876,076 B2 | 1/2024 | DeLaCruz et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2014/0175655 A1 | 6/2014 | Chen et al. | |
| 2015/0064498 A1 | 3/2015 | Tong | |
| 2015/0115455 A1* | 4/2015 | Chen | H10B 43/50 257/773 |
| 2016/0343682 A1 | 11/2016 | Kawasaki | |
| 2017/0236746 A1 | 8/2017 | Yu et al. | |
| 2017/0352678 A1* | 12/2017 | Lu | H10B 43/10 |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |

(56) References Cited

U.S. PATENT DOCUMENTS

| | | |
|---|---|---|
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0115277 A1 | 4/2019 | Yu et al. |
| 2019/0131277 A1 | 5/2019 | Yang et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0075553 A1 | 3/2020 | DeLaCruz et al. |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2020/0411483 A1 | 12/2020 | Uzoh et al. |
| 2021/0005593 A1* | 1/2021 | Lee .................. H10B 43/27 |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part No. "ONSEMI AR0820."

Plobi, A. et al., "Wafer direct bonding: tailoring adhesion between brittle materials," Materials Science and Engineering Review Journal, 1999, R25, 88 pages.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

* cited by examiner

APPARATUS FOR NON-VOLATILE RANDOM ACCESS MEMORY STACKS

CROSS-REFERENCE TO RELATED APPLICATIONS

This application is a continuation of U.S. Nonprovisional application Ser. No. 17/122,149, filed on Dec. 15, 2020, which claims the benefit of the filing date of U.S. Provisional Patent Application No. 62/951,668, filed on Dec. 20, 2019. The disclosure of each of the above applications is hereby incorporated herein by reference in its entirety.

BACKGROUND

Various types of existing memory each have significant limitations. For example, Dynamic Random Access Memory (DRAM) is fast, but low density and volatile. NAND is dense and inexpensive, but slow. Magnetic RAM (MRAM) is neither dense nor fast, and is also relatively expensive.

SUMMARY

One aspect of the disclosure provides a memory structure, including a NAND block comprising a plurality of oxide layers, the plurality of layers forming a staircase structure at a first edge of the NAND block, a plurality of vias disposed on the staircase structure of NAND block, two or more of plurality of vias terminating along a same plane, a plurality of first bonding interconnects disposed on the plurality of vias, a plurality of bitlines extending across the NAND block, and a plurality of second bonding interconnects disposed along the bitlines.

According to some examples, the plurality of first bonding interconnects may be substantially aligned in the same plane with the plurality of second bonding interconnects. Further, the plurality of first bonding interconnects and the plurality of second bonding interconnects may be embedded in a dielectric. According to some examples, the plurality of second bonding interconnects are spaced at wordline contact pitch or greater.

In some examples, the memory structure may further include a logic wafer, wherein the logic wafer is face-to-face bonded with the plurality of vias and the bitlines through the first and second bonding interconnects. The logic wafer may include a plurality of bonding interconnects on a bonding surface of the logic wafer. The plurality of bonding interconnects of the wafer may be bonded to the plurality of vias and bitlines using a non-adhesive direct bonding technique or a non-adhesive hybrid bonding technique.

According to some examples, the memory structure may further include at least one slit formed in the plurality of oxide layers, the at least one slit separating a first wordline structure from a second wordline structure. The plurality of bitlines may extend across the at least one slit.

Another aspect of the disclosure provides a stacked memory device, including at least one first stack layer and at least one second stack layer, wherein each of the first stack layer and the second stack layer include a NAND block comprising a plurality of oxide layers, the plurality of oxide layers forming a staircase structure at a first edge of the NAND block, a first plurality of vias disposed on the staircase structure of NAND block, a second plurality of vias disposed at the first edge of the NAND block, a plurality of first bonding interconnects disposed on and connected to the second plurality of vias, a plurality of bitlines extending across the NAND block, and a plurality of second bonding interconnects disposed along the bitlines.

According to some examples, the plurality of first bonding interconnects may be in the same plane with the plurality of second bonding interconnects and/or embedded in dielectric. The first plurality of bonding interconnects and the second plurality of bonding interconnects may all be in one plane embedded in a dielectric.

According to some examples, the stacked memory device further includes at least one slit formed in the plurality of oxide layers, the at least one slit separating a first wordline structure from a second wordline structure. The plurality of bitlines may extend across the at least one slit. Further, the stacked memory device may include a plurality of third vias disposed within the at least one slit, and a plurality of fourth vias disposed outside the stack layers. The plurality of second bonding interconnects disposed along the bitlines may be substantially aligned with the third plurality of vias.

According to some examples, the plurality of second bonding interconnects may be spaced at wordline contact pitch. Further, each of the first and second stack layers may further include a bitline redistribution layer disposed on an opposing side of the NAND block from the bitlines.

According to some examples, each of the first and second stack layers further comprises a silicon layer. The silicon layer may include logic for one or more operations within the stack layer. Such operations may include, for example, switching operations. Moreover, the memory structure may further include a shift register.

According to some examples, each stack layer may include an amount of remaining silicon. The amount of remaining silicon may be between 0.1 um to 6 um thick in some examples, or between 6 um to 20 um thick in other examples.

Each NAND block may further comprise logic for addressing at least one of data, wordline selection, serialization of data, or deserialization of data. The memory structure ma further include a third layer, the third layer comprising a logic layer, wherein silicon substrate has been completely removed from the first stack layer and the second stack layer.

DETAILED DESCRIPTION

F2F Bonded Structure

Figure 1:
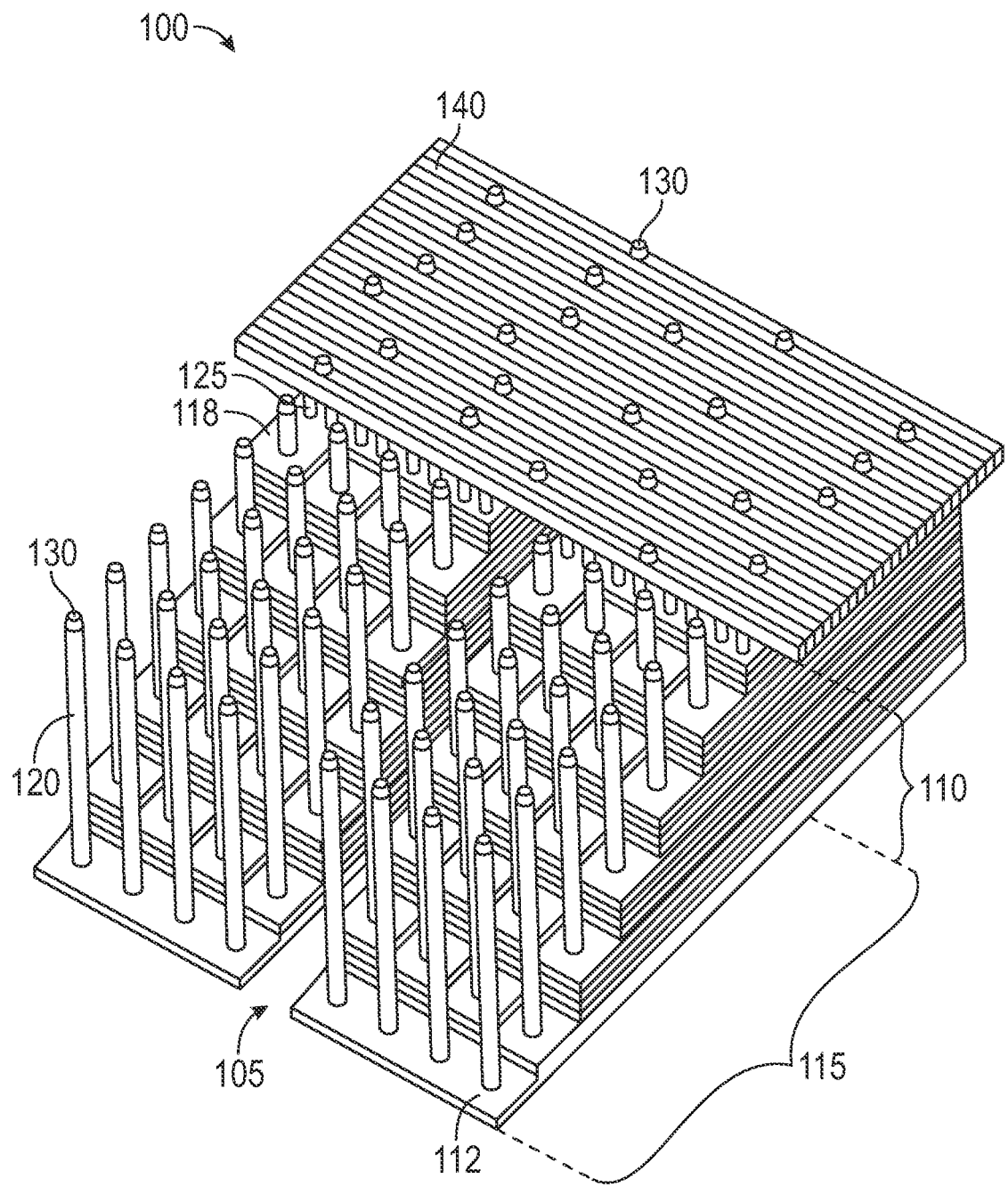
FIG. 1 is a perspective view of an example 3D-NAND structure (e.g. structure of 3D-NAND flash) according to aspects of the disclosure.

FIG. 1 illustrates an example nonvolatile memory (NVM), e.g. 3D-NAND structure 100, adapted for face-to-face bonding with another structure, such as a logic array. The 3D-NAND structure 100 includes a plurality of stacked oxide layers 110. For example, the stacked layers 100 include alternating and uniform layers of silicon oxide and silicon nitride stacked on top of a substrate. In other designs, alternating layers of silicon oxide and polysilicon (or some other conductive material) may also be used. The silicon nitride layers may be further processed, such as removed and replaced by tungsten or some other conductive material to form word lines or word planes. Stacks formed using alternating layers of silicon oxide and polysilicon do not need to replace the polysilicon layers with tungsten and instead use polysilicon as the word lines.

At a first edge of the structure 100, the oxide layers 110 are processed to form a staircase arrangement 115. The staircase arrangement is formed such that the conductive layers including word line planes are exposed. Any other arrangement, alternative to the staircase, may also be implemented to expose the conductive planes or layer.

The different layers, each separated by silicon oxide (or any other dielectric) layer, may have different functions. For example, majority of the conductive layers in the middle form word lines or word planes. The bottom of the stack 112 may be a source select layer, or a gate select layer, ground select layer, etc. A top of the stack 118 may be a drain select layer or a string select layer. According to some examples, the oxide layers 110 may be sized differently from one another. For example, some layers may be thicker than others, such as by making the top layer 118 and the bottom layer thicker as compared to the wordline layers in the center of the layer stack 110.

Before the staircase formation, strings or channels 125 are formed in the stack. The strings or channels formation include etching the holes through the whole stack and filling them with one or more conformal layers of various dielectrics, including but not limited to silicon oxide, silicon nitride, silicon oxynitride, and polysilicon. Memory cells may be formed at the location of each intersection of a string or channel with tungsten layer (or other conductive material) which replaced the silicon nitride layers.

According to some examples, a slit 105, such as a trench, extends between and isolates different sections of the stack.

The exposed layers may each have one or more wordline contacts 120 extending therefrom. The wordline contacts 120 may be made of tungsten or any of a variety of other conductive materials. Where the word line layers form a staircase arrangement 115, and the wordline contacts 120 extend from varying levels of the staircase, the wordline vias 120 may vary in size to terminate along a same plane. For example, wordline vias 120 extending from the bottom select layer 112 may be longer as compared to vias extending from the top select layer 118, such that all wordline contacts or vias 120 terminate along a plane parallel to any of the oxide layers 110 and to bitlines 140. According to other examples, the wordline vias 120 may terminate along more than one plane.

Bitlines 140 extend across the oxide layers 110 above the strings 125, and the strings 125 extend through the whole stack and connected to the bitlines 140 via bitline contacts (not shown here). While the bitlines 140 are shown in FIG. 1 as extending across only two sections of the stack separated by a slit 105, it should be understood that this is only a representative example and that the bitlines 140 may extend across many additional sections of the stack. Moreover, only a few bitlines 140 are shown. It should be understood that the wordline structure and the bitlines 140 may actually extend a significant distance in a direction opposite the staircase 115.

The wordline vias 120 are substantially aligned with bonding interconnects 130 along a longitudinal axis of each wordline via. In other examples, bonding interconnects 130 may be offset from the wordline contact vias 120 using a redistribution layer. The bonding interconnects 130 may be adapted for various bonding techniques, including direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). The bonding interconnects 130 may be used for bonding the 3D-NAND structure 100 to another structure. For example, the wordline vias 120 and bonding interconnects 130 may provide a connection between the wordlines of the 3D-NAND structure 100 and the other structure bonded thereto. In one example, the bonding interconnects 130 are embedded in a dielectric material (e.g. silicon oxide). Then structure 100 is direct bonded to another structure, a dielectric to dielectric bond between the 2 structures first occurs (at room temperature, without any adhesive or external pressure); as the structures are annealed at higher temperature, the interconnects 130 from 100 are bonded to the interconnects on the other structure The bitlines 140 may also include a plurality of bonding interconnects 130 on the opposite side of bitline contacts (not shown here). The bonding interconnects 130 on the bitlines 140 may be spaced apart. For example, each bitline 140 may include an interconnect 130 at one point of intersection with a wordline.

Figure 2A:
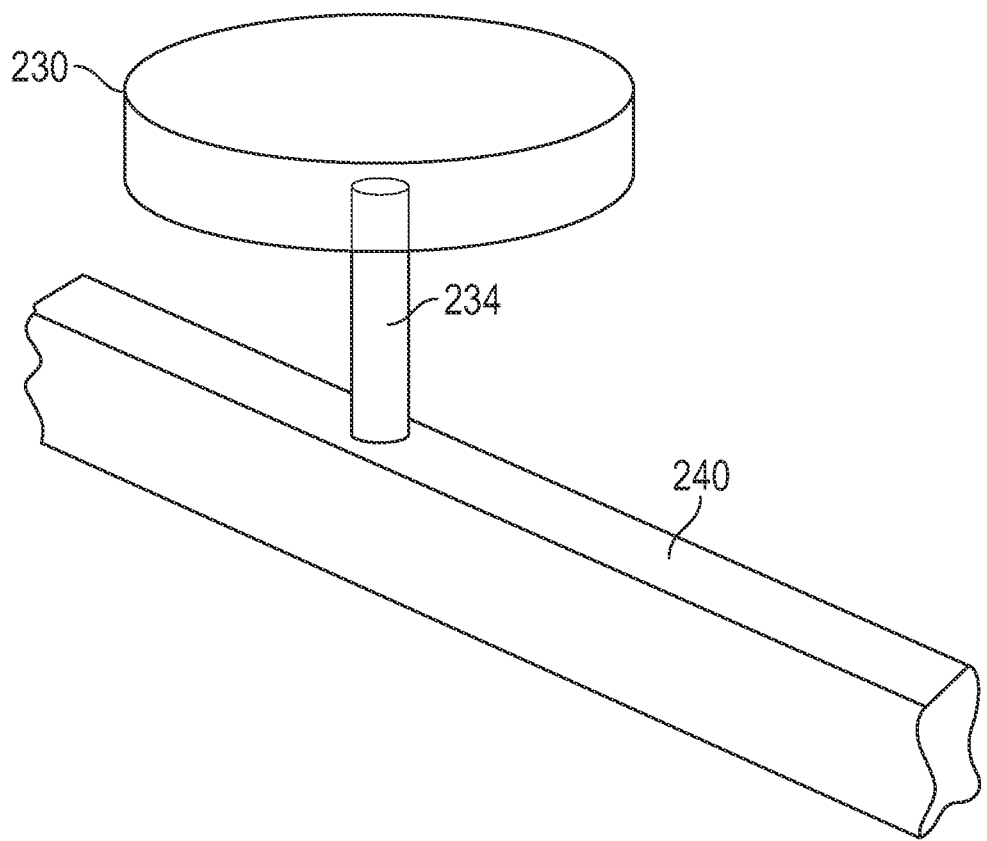
FIGS. 2A-B are perspective views of example interconnects on bitlines of the 3D-NAND structure of FIG. 1.
Figure 2B:
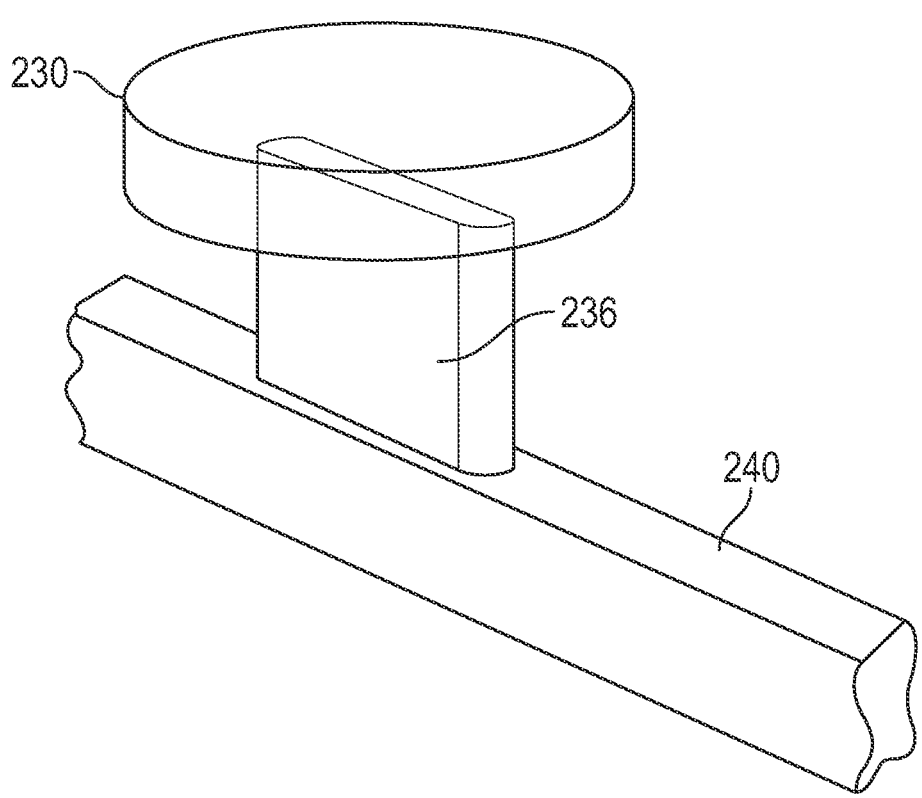

The bonding interconnects 130 may be coupled to the bitlines 140 through an interconnect structure. FIGS. 2A-2B illustrate examples of such interconnect structures.

As shown in FIG. 2A, bonding interconnect 230 is coupled to bitline 240 through structure 234. The structure 234 is a narrow, substantially cylindrical structure, such as a circular via. The structure 234 may be made of tungsten or any other conductive material. The structure 234 separates the bonding interconnect 230 from the bitline 240 by a predetermined distance, typically under 1micron, though the predetermined distance may vary. In this regard, the bonding interconnect 230 may be wider than a width of a single bitline. Even in such circumstance, the bonding interconnect 230 may couple to a single bitline 240 without unintentionally coupling to a neighboring bitline.

FIG. 2B shows another example, where structure 236 is elongated as compared to the structure 234 of FIG. 2A. In this regard, the structure 236 may contact a greater surface area of the bonding interconnect 230 and the bitline 240, thereby providing for a more stable coupling. Although only one contact structure is shown connecting the bonding interconnect 230 and the bitline 240, two or more such contact structures may also be used. Although only one the bonding interconnect 230 is shown to connect to each bitline 240, two or more interconnects 230 may also be used to contact a single bitline, spread along the length of that single bitline 120

The bonding interconnects 130 of FIG. 1 allow for the 3D-NAND structure 100 to be coupled to another structure, such as a logic block or another 3D-NAND structure. For example, the 3D-NAND structure 100 may be face-to-face bonded with the other structure.

Figure 3:
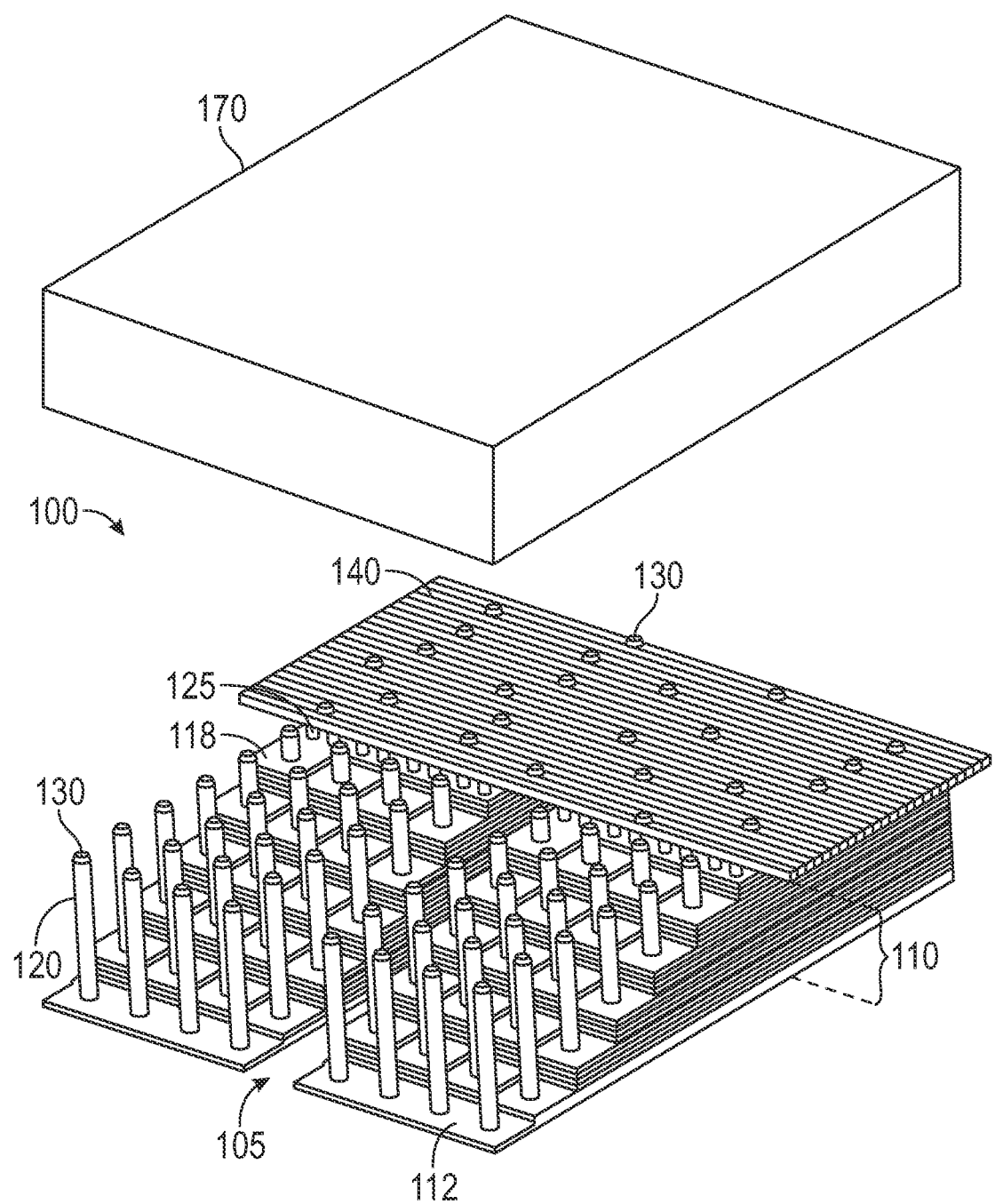
FIG. 3 is a perspective view of the 3D-NAND structure of FIG. 1 adapted to be face-to-face bonded with a logic wafer according to aspects of the disclosure.

FIG. 3 illustrates the 3D-NAND structure 100 being coupled with logic wafer 170. The source select layer 112, drain select layer 118, ground, and other elements may be directly interconnected with the logic wafer 170 through the bonding interconnects 130 on the vias 120 and the bitlines 140.

Stack without Remaining Silicon on 3D-NAND Layer

According to some examples, the 3D-NAND structure 100 of FIG. 1 may be stacked vertically with one or more other 3D-NAND structures. In such a stack, silicon may be removed from the 3D-NAND structures or it may remain, each discussed in further detail below.

Figure 4:
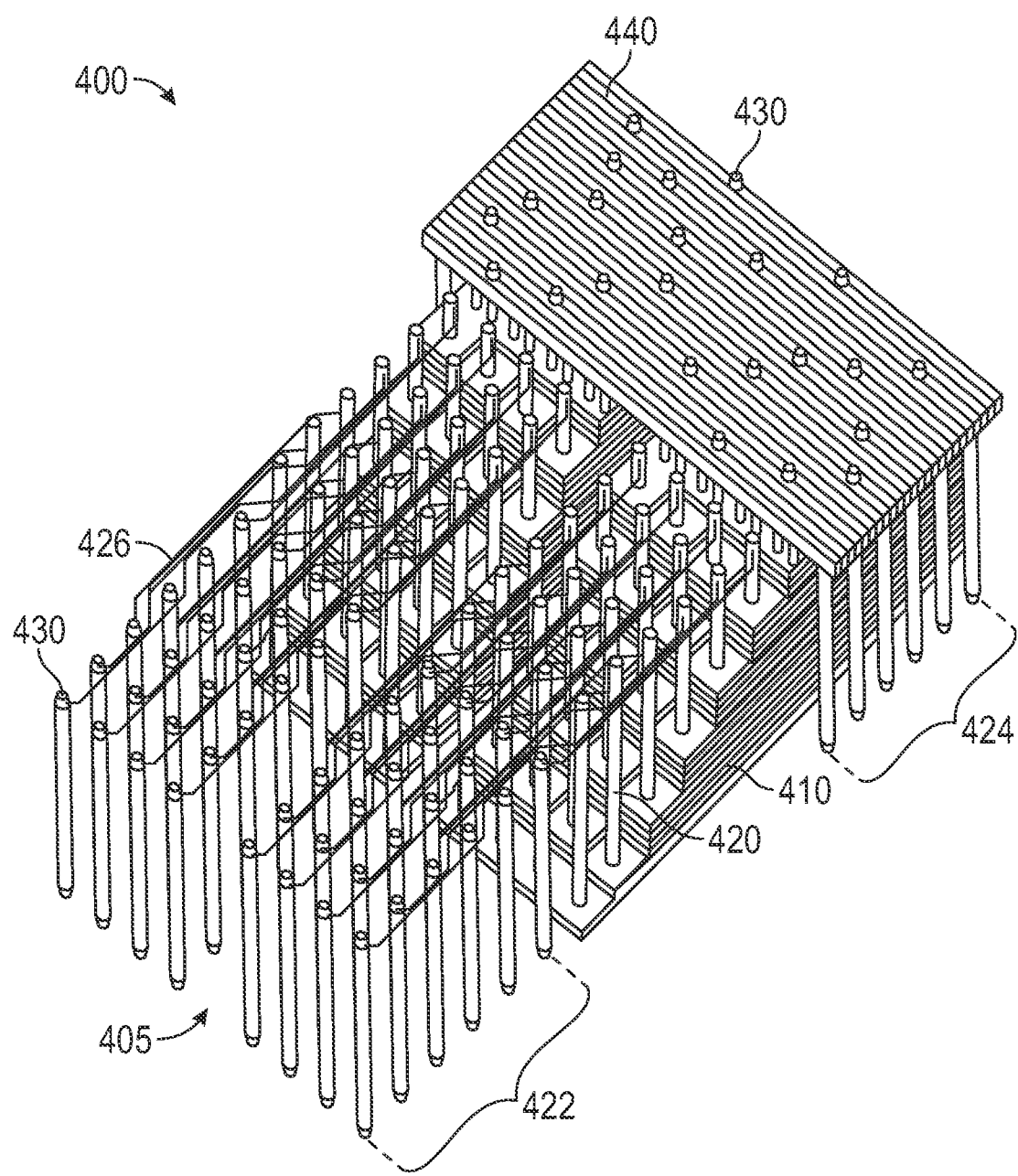
FIG. 4 is a perspective view of another example 3D-NAND structure configured to be stacked according to aspects of the disclosure.

FIG. 4 illustrates a 3D-NAND structure 400 for stacking. In this example, bitlines 440 are coupled to a plurality of bitline vias 424. The bitline vias 424 may reside in slits 405. The bitline vias 424 may further reside along edges of the 3D-NAND structure 400 for coupling to edge portions of the bitline 440. The bitline vias 424 may be built in a same process as used to build wordline vias 420.

Wordlines may be redistributed beyond the oxide layers 410 to enable further stacking, since the wordlines may not go through the oxide layers 410. As an example of such redistribution, edge vias 422 may be positioned at an edge of the staircase. The edge vias 422 may be copies of wordline vias 420. Each of the edge vias 422 may be linked to the wordline via 420 of which it is a copy. For example, the edge vias 422 and wordline vias 420 may be linked by a plurality of links 426, such as wires, traces, or other connections. As the wordlines are redistributed, bonding interconnects 430 may also be moved from wordline vias 420 to the edge vias 422.

Figure 5:
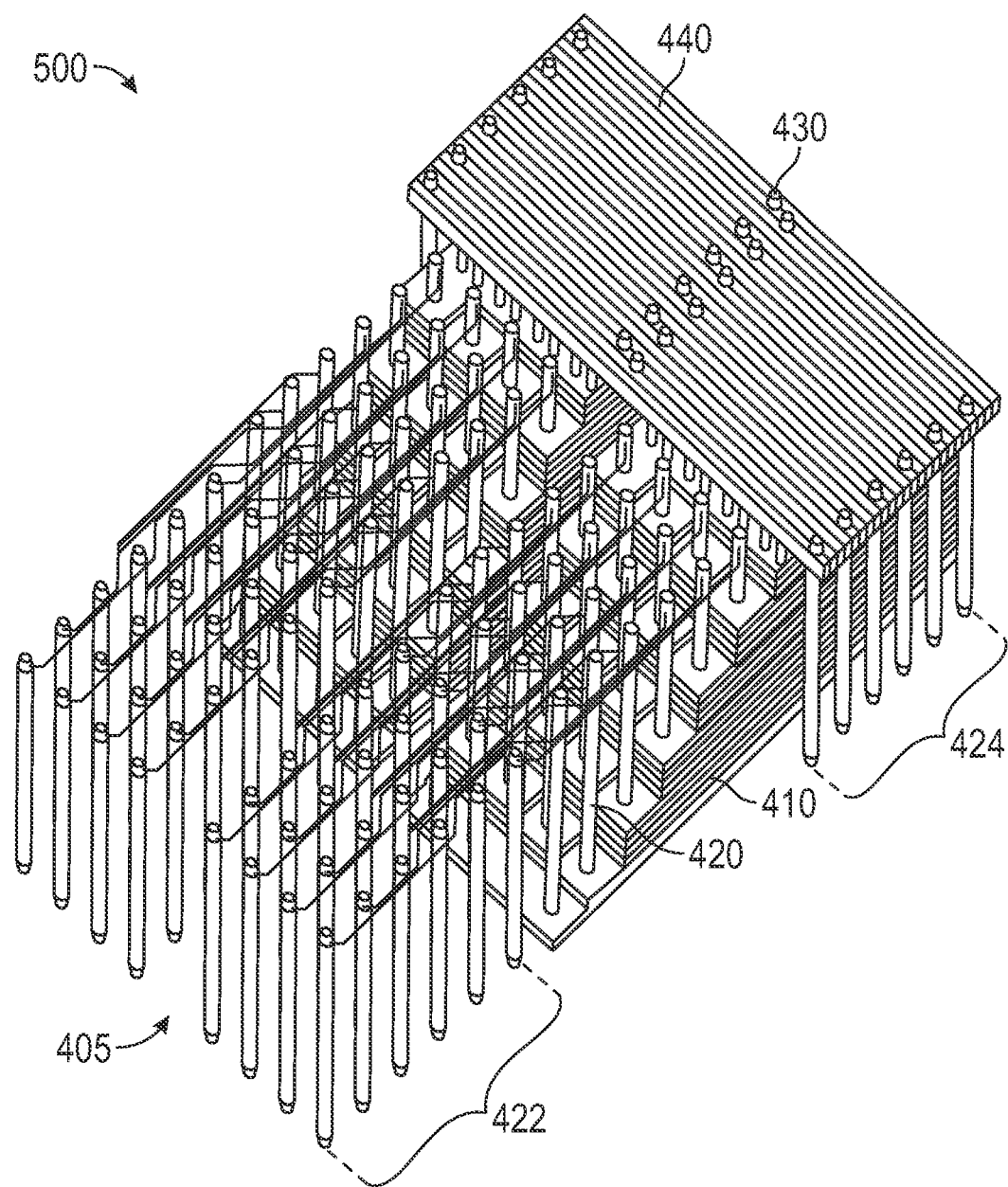
FIG. 5 is a perspective view of another example 3D-NAND structure configured to be stacked according to aspects of the disclosure.

Bonding interconnects 430 on the bitlines, as shown in FIG. 4, may be spaced at wordline pitch. For example, similar to FIG. 1, one bonding interconnect 430 may be positioned on each bitline 440. In other example, bonding interconnect 430 may be spaced at different pitches at different locations FIG. 5 illustrates another example embodiment 500. Similar to FIG. 4, the embodiment of FIG. 5 includes wordline vias 420 redistributed beyond the staircase as edge vias 422, and bitline vias 424. In this example, however, the bonding interconnects 430 on the bitlines 440 are aligned with the bitline vias 424.

Figure 6A:
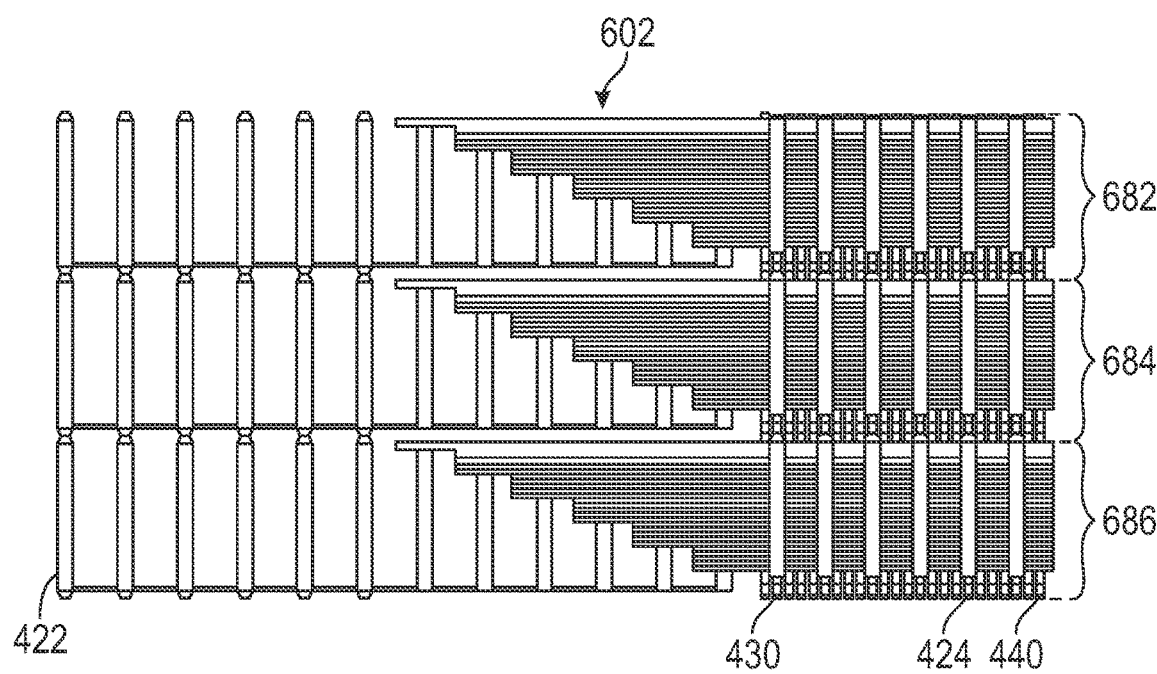
FIG. 6A is a side view of an example 3D-NAND stack according to aspects of the disclosure.
Figure 6B:
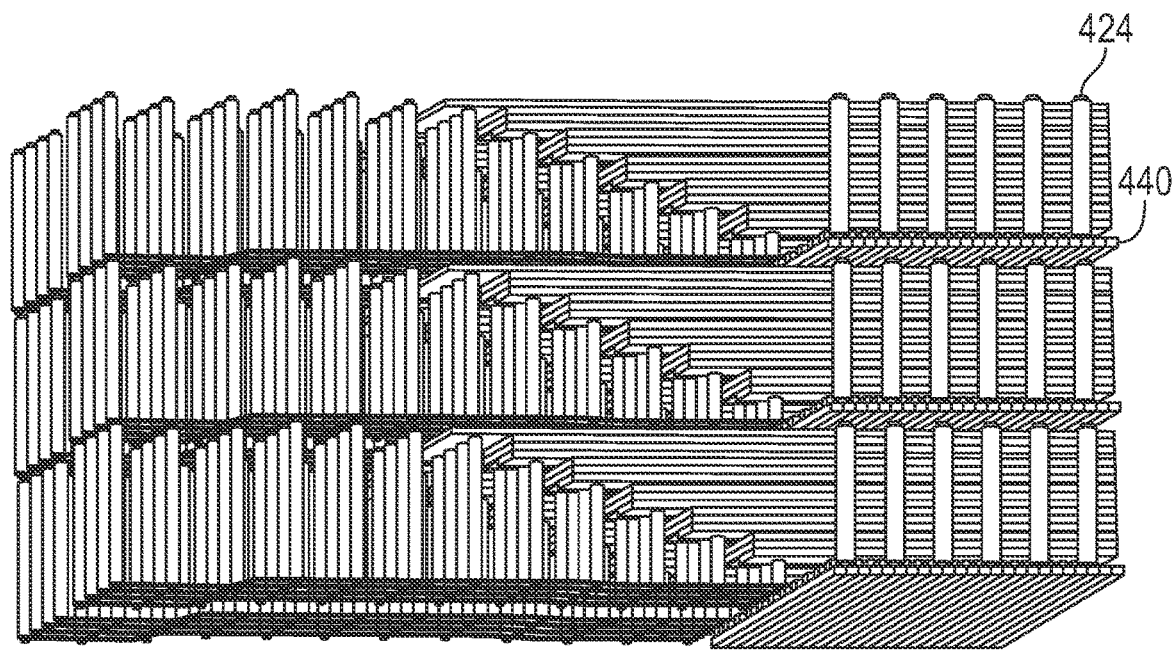
FIG. 6B is a perspective view of the example 3D-NAND stack of FIG. 6A.

FIGS. 6A-B illustrate a stacked arrangement of the 3D-NAND structures 400 described above in connection with FIG. 4. FIG. 6A provides a side view of the stack while FIG. 6B provides a perspective view of the same stack. While only three layers of the stack are shown, it should be understood that additional or fewer layers may be included. Moreover, in addition to layers of 3D-NAND structures, the stack may further include other structures, such as a logic layer. Such logic layer may be positioned at a bottom layer of the stack, such that the bond interconnects 430 on the bitlines 440 couple to the logic layer. In other examples, such logic layer may be positioned at a top layer of the stack, where the bond interconnects 430 on the bitlines 440 are redistributed through the bitline vias 424.

In some examples, the stack layers may be direct bonded. According to other examples, the layers may be sequentially built.

When stacked, the edge vias 422 of a first layer of the stack align with the edge vias of a second layer of the stack and a third layer of the stack, etc. Moreover, the bitline vias 424 of the first layer of the stack align with the bitline vias of the second and third layers, etc. Accordingly, the edge vias 422 and bitline vias 424 connect the first level of the stack to the second level to the third level, etc.

As shown, all silicon has been removed from a widest portion 602 of the oxide layers 410. In other examples, described below, the silicon or other dielectric may remain in the stack.

The stack may further include a vertical switch or transistor (not shown). When data is received for storage in the stack, the vertical switch or transistor may be used to determine which stack layer 682, 684, 686 the data should be sent to. For example, a particular line may be charged to activate a corresponding stack layer 682, 684 686.

As shown in FIGS. 6A-B, bitlines from a bottom side of each layer are repeated on the opposite (top) side. In other examples, repetition of the bitlines may be omitted. For example, if the layers of the stack are 3D-NAND structures 500 as in FIG. 5, wherein the bonding interconnects on the bitlines align with the bitline vias, such repetition may not be needed.

Figure 7:
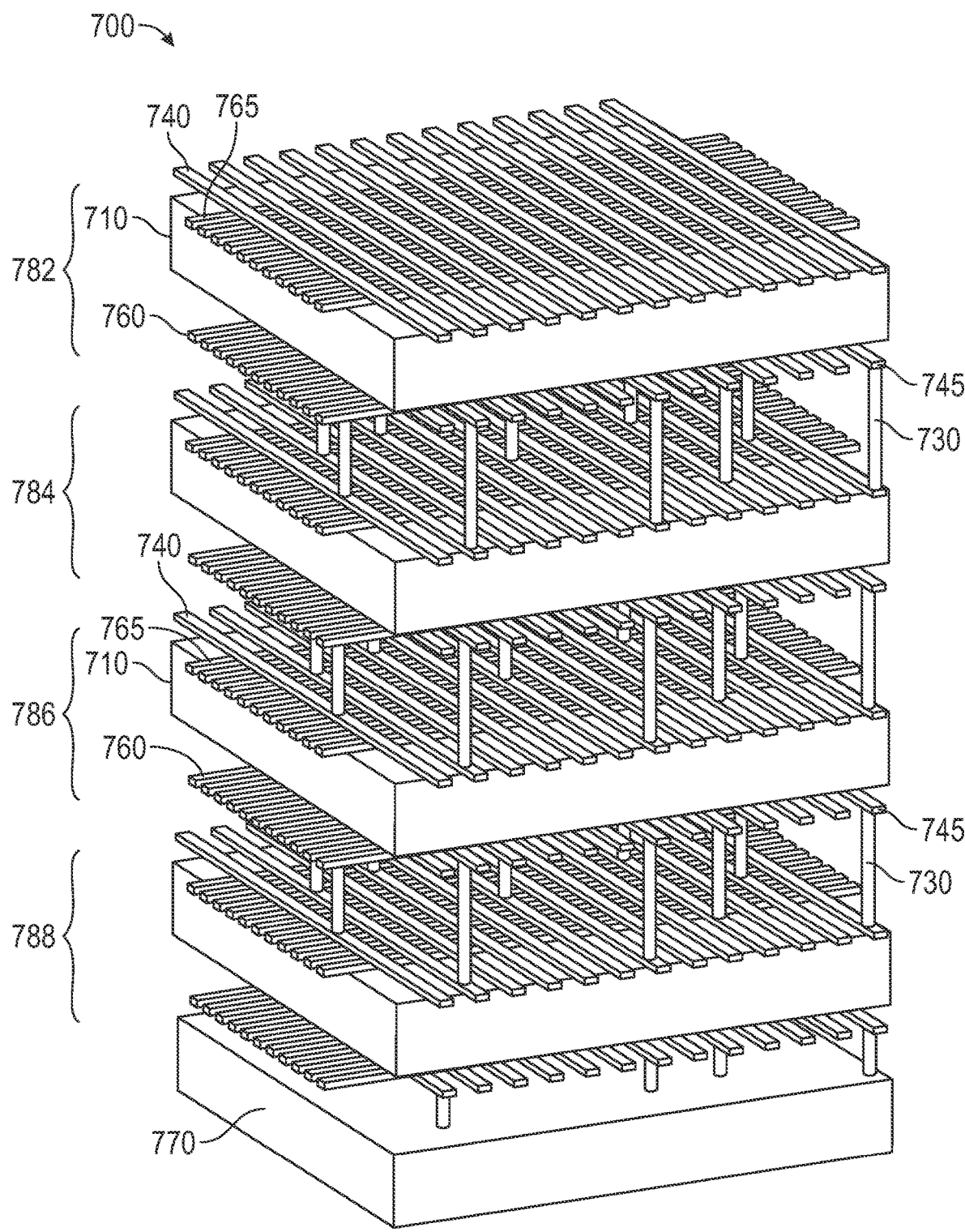
FIG. 7 is a 3D schematic diagram of an example stacked memory according to aspects of the disclosure.

FIG. 7 is a schematic diagram illustrating interconnection of components in the 3D-NAND stack 700. It should be understood that the elements of the stack as shown in FIG. 7 are not to scale, or otherwise sized or shaped as they may be in an actual stack, but rather are intended to show the relationship and interconnection of components. Moreover, as shown the stack includes four layers 782-788 of 3D-NAND. However, similar to the other examples described above, additional or fewer layers may be included. Each of the layers 782-788 includes substantially the same elements.

As shown, each layer 782-788 includes a 3D-NAND array 710. For example, while the 3D-NAND array 710 is shown as a block, it may actually include a plurality of oxide layers arranged in a staircase arrangement as described above in connection with FIG. 1. Each 3D-NAND array 710 may include one or more source select layers and one or more drain select layers. There may be relatively few source select layers, such as 1-8 source select layers, and relatively few drain select layers. As such, the source select layers and drain select layers may be individually routed from the logic layer 770.

A plurality of wordlines 760 are shown for the 3D-NAND array 710. A wordline redistribution 765 may also be included. According to some examples, the wordlines 760 of a first layer 782 may not be the same as the wordlines of a second layer 784. For example, the wordlines of different layers may have different switching capabilities.

Each stack layer may include a plurality of bitlines 740 extending along a first side of the 3D-NAND array 710 and a bitline redistribution 745 on an opposing side of the 3D-NAND array 710. The bitlines 740 and bitline redistribution 745 may extend in an opposing direction as compared to the wordlines 760 and wordline redistribution 765. In some examples, the bitline redistribution 745 may be omitted. For example, referring back to the example of FIG. 5, where the bitline vias 424 align with the bonding interconnects 430 on the bitlines 440, bitlines may be coupled to a next layer of a stack through the bitline vias 424, and therefore bitline redistribution may not be needed.

Bonding interconnects 730 may be used to couple each layer 782-788 of the stack. For example, bonding interconnects 730 extend between the bitline redistribution 745 of a first layer 782 and the bitlines 740 of a second layer 784. The connectivity between each of the layers 782-788 may be common, for example, if the bitlines 740 of each layer are common.

Stack with Remaining Silicon on 3D-NAND Layer

According to some examples, rather than removing silicon from the stack, silicon may be retained in the stack. In this regard, rather than all logic operations occurring in a separate logic layer in the stack, logic operations may be performed at each individual layer of the stack. For example, switching between bitlines in each layer may be performed to enable which layer is accessed. As another example, switching between wordline addresses in each layer may be performed to enable which layer is accessed.

Figure 8:
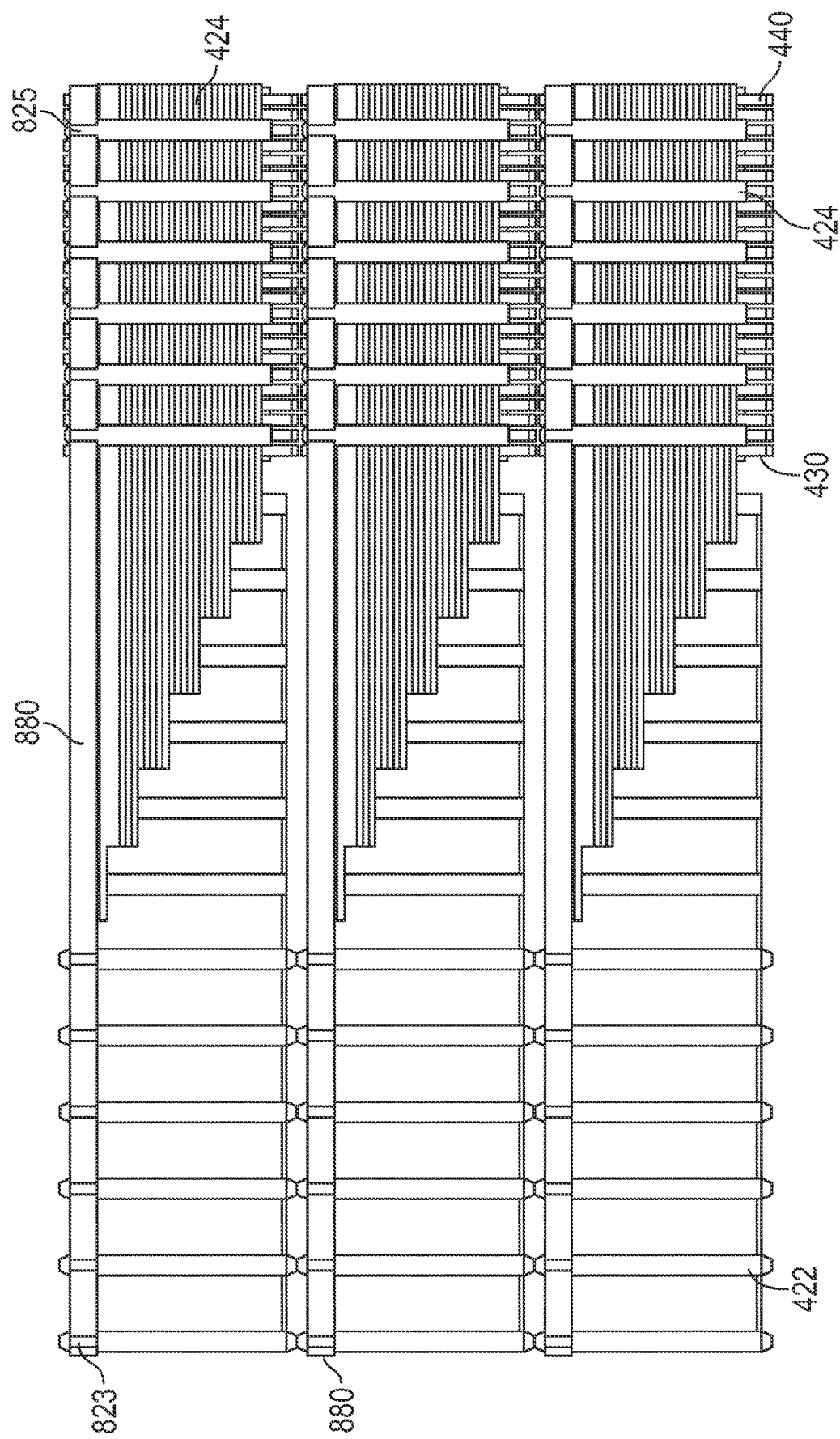
FIG. 8 is a side view of another example 3D-NAND stack according to aspects of the disclosure.

FIG. 8 illustrates a stacked arrangement of 3D-NAND structures wherein a silicon or other dielectric layer has been retained in each 3D-NAND layer of the stack. Similar to FIG. 6A, FIG. 8 provides a side view of the stack. While only three layers of the stack are shown, it should be understood that additional or fewer layers may be included.

In contrast to FIG. 6A, the stack of FIG. 8 includes a silicon layer 880 at a widest portion 602 of the oxide layers 410. The silicon layer 880 may be used to store logic functions, such as registers used for switching or other operations. Vias 823, 835, such as through-silicon vias (TSVs may extend through the silicon layer 880 and couple to edge vias 422 and bitline vias 424, respectively. Accordingly, when stacked, the edge vias 422 of a first layer of the stack align with the edge vias of a second layer of the stack and a third layer of the stack, etc., and couple to one another through the silicon 880 by way of the TSVs 823. The bitline vias 424 of the first layer of the stack align with the bitline vias of the second and third layers, etc., and couple to one another through the silicon 880 by way of the TSVs 825. Accordingly, the edge vias 422 and bitline vias 424 connect the first level of the stack to the second level to the third level, etc.

While the silicon layer 880 is shown as having a particular thickness in proportion to the oxide layers, it should be understood that the thickness of the silicon layer 880 may be varied. For example, a portion of the silicon layer 880 may be selectively removed.

Figure 9:
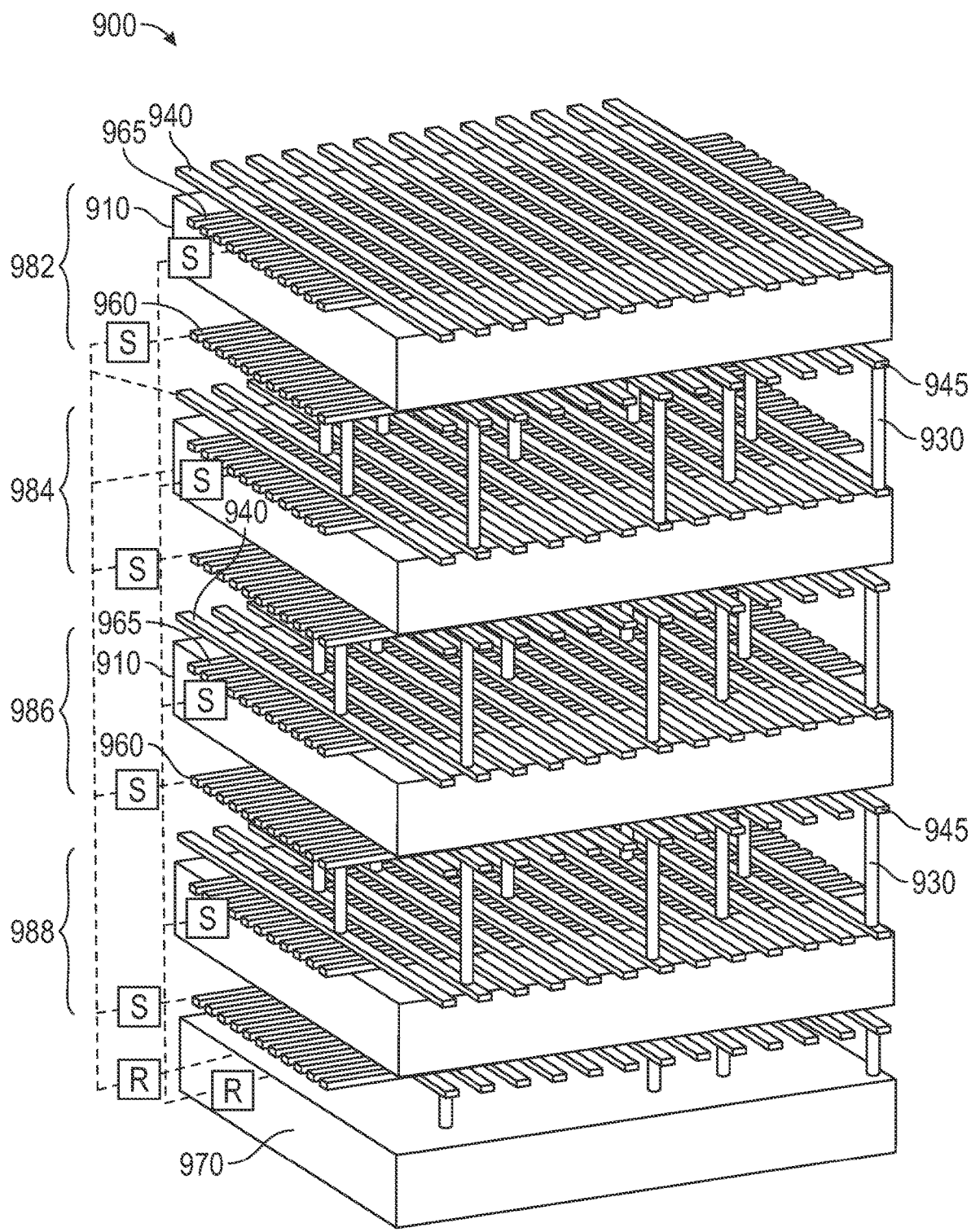
FIG. 9 is a 3D schematic diagram of another example stacked memory according to aspects of the disclosure.

FIG. 9 illustrates an example 3D schematic of a stack 900 including a plurality of 3D-NAND layers where silicon has been retained. Similar to the stack 700 of FIG. 7, the elements of the stack as shown in FIG. 9 are not to scale, or otherwise sized or shaped as they may be in an actual stack, but rather are intended to show the relationship and interconnection of components. Moreover, as shown the stack includes four layers 982-988 of 3D-NAND. However, similar to the other examples described above, additional or fewer layers may be included.

As shown, each layer 982-988 includes a 3D-NAND array 910, which may include one or more source select layers and one or more drain select layers. Source select layers and drain select layers may be individually routed from the logic layer 970.

A plurality of wordlines 960 are shown in FIG. 9 for the 3D-NAND array 910, and a wordline redistribution 965 is further shown. Each stack layer may include a plurality of bitlines 940 and a bitline redistribution 945. In some examples, the bitline redistribution 945 may be omitted. For example, referring back to the example of FIG. 5, where the bitline vias 424 align with the bonding interconnects 430 on the bitlines 440, bitlines may be coupled to a next layer of a stack through the bitline vias 424, and therefore bitline redistribution may not be needed.

Bonding interconnects 930 may be used to couple each layer 982-988 of the stack. For example, bonding interconnects 930 extend between the bitline redistribution 945 of a first layer 982 and the bitlines 940 of a second layer 984. The connectivity between each of the layers 982-988 may be common, for example, if the bitlines 940 of each layer are common.

In contrast to the stack 700 of FIG. 7, however, the stack 900 of FIG. 9 may include a shift register [R] in each 3D-NAND array 910. The shift register [R] may provide for serializing and deserializing data. For example, the shift register [R] can be used as a Serial In Parallel Out (SIPO) register and/or as a Parallel In Serial Out (PISO) register. As such, simultaneous read/write access may be achieved, and a fast clocking rate may be achieved as compared to the stack 700 of FIG. 7.

The source select layers and drain select layers of each 3D-NAND array 910 may include a switch [S] to select between physical die layers. The logic may also switch for the source select, drain select, and other select layers, as well as the bitlines.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A memory structure, comprising:
a memory array comprising a plurality of vertical channels extending in a vertical direction through a stack comprising a plurality of wordline layers alternating with a plurality of insulating layers, wherein the vertical channels are electrically connected to a plurality of bitlines extending over the memory array in a horizontal direction; and
a plurality of first bonding interconnect structures electrically connected to the wordline layers and a plurality of second bonding interconnect structures electrically connected to the bitlines, wherein the first and second bonding interconnect structures are disposed at substantially the same vertical level over the bitlines to direct bond to an integrated circuit (IC) structure above the memory array without using an adhesive material.

2. The memory structure of claim 1, wherein one or both of the first and second bonding interconnect structures are embedded in a dielectric material to form a bonding surface configured for hybrid direct bonding with the IC structure.

3. The memory structure of claim 1, wherein the memory array comprises a NAND flash memory array.

4. The memory structure of claim 1, wherein the stack forms a staircase structure with successive wordline layers having end portions that successively decrease in lateral lengths.

5. The memory structure of claim 4, wherein the wordline layers are electrically connected to the first bonding structures by wordline vias extending in the vertical direction at the end portions.

6. The memory structure of claim 5, wherein the first bonding interconnect structures are physically formed on or over the wordline vias.

7. The memory structure of claim 5, further comprising edge wordline vias that are disposed laterally outside of the staircase structure, and wherein the first bonding interconnect structures are physically formed on or over the edge wordline vias.

8. The memory structure of claim 5, further comprising bitline vias connected contacted to the bitlines and extending vertically downward across the stack.

9. The memory structure of claim 1, wherein the IC structure comprises logic circuitry bonded to the memory array through the first and second bonding interconnect structures.

10. The memory structure of claim 9, wherein the stack further comprises select gate layers electrically connected and controlled by the logic circuitry.

11. The memory structure of claim 1, wherein a silicon substrate has been removed from the memory structure such that the memory array is not disposed over the silicon substrate.

12. A memory device, comprising:
  a memory array comprising a plurality of vertical channels extending in a vertical direction through a stack comprising a plurality of wordline layers alternating with a plurality of insulating layers, wherein the vertical channels are electrically connected to a plurality of bitlines extending over the memory array in a horizontal direction;
  a plurality of first bonding interconnect structures electrically connected to the wordline layers and disposed at a vertical level over the bitlines; and
  a further integrated circuit (IC) structure stacked on and direct bonded to the memory array through the first bonding interconnect structures without using an adhesive material.

13. The memory device of claim 12, further comprising a plurality of second bonding interconnect structures electrically connected to the bitlines, wherein the first and second bonding interconnect structures substantially coterminate at the vertical level over the bitlines.

14. The memory device of claim 12, wherein the further IC structure comprises logic circuitry configured to control the memory array.

15. The memory device of claim 14, wherein the stack further comprises select gate layers electrically connected to the logic circuitry.

16. The memory device of claim 12, wherein the further IC structure is a second memory array.

17. The memory device of claim 16, wherein the second memory array comprises a second plurality of vertical channels extending in the vertical direction through a second stack comprising a plurality of second wordline layers alternating with a second plurality of insulating layers, wherein the second vertical channels are electrically connected to a second plurality of bitlines extending over the second memory array in the horizontal direction.

18. The memory device of claim 12, wherein the stack forms a staircase structure with successive wordline layers having end portions that successively decrease in lateral lengths.

19. The memory device of claim 18, wherein the wordline layers are electrically connected to the first bonding interconnect structures by wordline vias extending in the vertical direction at the end portions.

20. The memory device of claim 19, wherein the first bonding interconnect structures are physically formed on or over the wordline vias.

21. The memory device of claim 18, wherein the memory array further comprises edge wordline vias that are physically disposed laterally outside of the staircase structure, and wherein the first bonding interconnect structures are physically formed on or over the edge wordline vias.

* * * * *

UNITED STATES PATENT AND TRADEMARK OFFICE
CERTIFICATE OF CORRECTION

| | | |
|---|---|---|
| PATENT NO. | : 12,288,771 B2 | Page 1 of 1 |
| APPLICATION NO. | : 18/519538 | |
| DATED | : April 29, 2025 | |
| INVENTOR(S) | : Javier A. DeLaCruz | |

It is certified that error appears in the above-identified patent and that said Letters Patent is hereby corrected as shown below:

In the Specification

Column 4, Line 34, delete "other structure" and insert -- other structure. --.

Column 4, Line 67, delete "bitline 120" and insert -- bitline 120. --.

Column 5, Line 42, delete "different locations" and insert -- different locations. --.

In the Claims

Column 9, Line 5, Claim 8, delete "vias connected contacted to the bitlines" and insert -- vias connected to the bitlines --.

Signed and Sealed this
Twenty-fourth Day of June, 2025

Coke Morgan Stewart
*Acting Director of the United States Patent and Trademark Office*